(12) United States Patent
Kida et al.

(10) Patent No.: US 7,759,223 B2
(45) Date of Patent: Jul. 20, 2010

(54) SEMICONDUCTOR WAFER AND MANUFACTURING PROCESS FOR SEMICONDUCTOR DEVICE

(75) Inventors: Tsuyoshi Kida, Kanagawa (JP); Takamitsu Noda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/465,349

(22) Filed: May 13, 2009

(65) Prior Publication Data

US 2009/0227088 A1 Sep. 10, 2009

Related U.S. Application Data

(62) Division of application No. 11/152,092, filed on Jun. 15, 2005, now Pat. No. 7,554,211.

(30) Foreign Application Priority Data

Jun. 22, 2004 (JP) ............................. 2004-183892
Aug. 12, 2004 (JP) ............................. 2004-235020

(51) Int. Cl.
*H01L 21/00* (2006.01)

(52) U.S. Cl. ...................... 438/462; 438/460; 438/463; 257/E21.001; 257/E23.179; 257/E21.599

(58) Field of Classification Search ................ 438/460, 438/462, 463; 257/E21.001, E21.599, E23.179
See application file for complete search history.

(56) References Cited

U.S. PATENT DOCUMENTS

| | | | |
|---|---|---|---|
| 5,051,807 A | | 9/1991 | Morozumi |
| 5,096,855 A | * | 3/1992 | Vokoun, III ................. 438/462 |
| 5,496,777 A | | 3/1996 | Moriyama |
| 5,903,489 A | | 5/1999 | Hayano |
| 6,329,700 B1 | * | 12/2001 | Ishimura et al. ............. 257/620 |
| 6,596,562 B1 | | 7/2003 | Maiz |
| 6,603,162 B1 | | 8/2003 | Uchiyama et al. |
| 6,713,843 B2 | | 3/2004 | Fu |
| 6,869,861 B1 | | 3/2005 | Glenn et al. |
| 6,893,943 B2 | | 5/2005 | Ohsumi et al. |

(Continued)

FOREIGN PATENT DOCUMENTS

JP  63-250119  10/1988

(Continued)

OTHER PUBLICATIONS

Japanese Patent Office issued a Japanese Office Action dated May 26, 2009, Application No. 2004-235020.

*Primary Examiner*—Charles D Garber
*Assistant Examiner*—Angel Roman
(74) *Attorney, Agent, or Firm*—Young & Thompson

(57) ABSTRACT

A semiconductor wafer 1 has first scribe lines 31 in two mutually perpendicular directions which have a first width and divide the semiconductor wafer 1 into a plurality of areas; second scribe lines 32 which have a second width smaller than the first width and divide the area into a plurality of semiconductor chip areas 2; an electrode pad 5 formed along the edge of the semiconductor chip area 2; and a metal-containing accessory pattern 4 disposed in the scribe lines. In the second scribe lines 32, the accessory pattern 4 is absent in at least the outermost surface in an area adjacent to the edge having the electrode pad 5 in the chip area 2.

13 Claims, 15 Drawing Sheets

U.S. PATENT DOCUMENTS

| | | | |
|---|---|---|---|
| 2003/0003677 A1* | 1/2003 | Fukada | 438/401 |
| 2005/0101108 A1 | 5/2005 | Genda et al. | |
| 2005/0110065 A1 | 5/2005 | Uchiyama et al. | |
| 2005/0212092 A1 | 9/2005 | Nishizawa | |
| 2007/0184634 A1 | 8/2007 | Suzuki et al. | |
| 2008/0227226 A1 | 9/2008 | Fujii et al. | |

FOREIGN PATENT DOCUMENTS

| | | |
|---|---|---|
| JP | 1-304721 | 8/1989 |
| JP | 02-017657 | 1/1990 |
| JP | 402101758 | 4/1990 |
| JP | 11-233458 | 8/1999 |
| JP | 2000-124158 | 4/2000 |
| JP | 2000-340746 | 8/2000 |
| JP | 2001-076997 | 3/2001 |
| JP | 2002-176140 | 6/2002 |
| JP | 2003-320466 | 11/2003 |

* cited by examiner

PRIOR ART

PRIOR ART

PRIOR ART

PRIOR ART

SEMICONDUCTOR WAFER AND MANUFACTURING PROCESS FOR SEMICONDUCTOR DEVICE

This application is based on Japanese patent application NO. 2004-183892 and 2004-235020, the contents of which are incorporated hererinto by reference.

BACKGROUND OF THE INVENTION

1. Field of the Invention

This invention relates to a semiconductor wafer and a process for manufacturing a semiconductor device, particularly to a process for dividing a semiconductor wafer into separate semiconductor chips by dicing and a semiconductor wafer used for the process.

2. Description of the Related Art

Conventionally, a semiconductor chip has been manufactured as follows. First, a plurality of semiconductor chips 2 are formed on a semiconductor wafer 1 (FIG. 1). Then, along scribe lines 3 between the areas with a semiconductor clap 2, the semiconductor wafer 1 is cut with a cutter known as a dicing blade. Thus, the blade-cut areas 13 are formed to divide the wafer into separate semiconductor chips 12 (FIG. 4). Such a process for dividing a water into separate semiconductor drips 12 is generally called dicing.

For dicing, it is necessary that the dicing blade cuts the semiconductor wafer 1 precisely along the scribe Line 3. Therefore, as shown in FIG. 2, an alignment mark 41 is formed on the scribe line 3 for aligning the dicing blade using the alignment mark 41 as a guide nark. The alignment mark 41 may be made oil a metal film, where a difference in a reflectance is generated, between the semiconductor wafer 1 and the metal alignment mark 41. Thus, a position of the alignment mark 41 can be checked by the difference in a reflectance, allowing the dicing blade to be aligned. Such technique has been disclosed in, for example, Laid-open, patent publication No. 1989-304721.

In addition, there may be formed, a TEG (Test Element Group) 42 on the scribe line 3, which may contain a metal. Such technique has been disclosed in, for example, Laid-open patent publication No. 2002-176140.

Recently, a semiconductor chip has been significantly size-reduced. Size reduction in a semiconductor chip increases the number of semiconductor devices obtained from a piece of semiconductor wafer. However, when a scribe line has the same width as that of a scribe line in a conventional semiconductor wafer, a proportion, of the scribe line is increased in an area on the semiconductor wafer. Therefore a width of a scribe line must be reduced for further increasing the number of semiconductor chips obtained from a piece of semiconductor wafer.

However, when a scribe line has a shorter width than that in a conventional semiconductor wafer, chipping during dicing may cause damage in a semiconductor chip. In particular, an interlayer insulating film formed on a semiconductor wafer is more fragile than the semiconductor wafer itself, so that chipping in an interlayer insulating film on a scribe line probably reaches an interlayer insulating film in a semiconductor chip area.

Thus, as shown in FIG. 3, there has developed technique that a scribe line 3 is irradiated with a laser beam to remove an interlayer insulating film in the scribe line 3 in advance, before cutting with a dicing blade. This technique has been disclosed, in, for example, Laid-open patent publication No. 2003-320466. Using this technique, a laser irradiation area 10 is formed in the scribe line 3. Since the area dices not have an interlayer insulating film, chipping in an interlayer insulating film on an scribe line can be avoid during cutting with, a dicing blade. Therefore, chipping never reaches an area in which a semiconductor chip is formed.

Laid-open patent publication No. 1988-250119 has described means for maximizing the number of semiconductor chips obtained from a piece of semiconductor wafer. Specifically, there has been disclosed a semiconductor wafer where in a strip type semiconductor chip, a scribe line between, shorter edges has a shorter width than, that of a scribe line between, longer edges and an accessory pattern is f armed on the scribe line between, shorter edges (See, FIG. 2 therein).

SUMMARY OF THE INVENTION

The present inventors have now discovered that the above prior art has the following problems.

If an accessory pattern is irradiated with a laser during laser irradiation on a scribe line, a metal contained in the accessory pattern is scattered. Here, when an electrode pad is formed, in an area near the scribe line in the semiconductor chip, the scattered, metal contaminates the electrode pad. Such contamination of the electrode pad poses a problem in a subsequent process such as wire bonding. This problem becomes more significant as a width of a scribe line becomes shorter.

According to the present invention, there is provided a semiconductor wafer, comprising first scribe lines in two mutually perpendicular directions which have a first width and divide the semiconductor wafer into a plurality of areas;

second, scribe lines which leave a second width smaller than the first width, and divide the area into a plurality of chip areas;

an electrode pad formed along the edge of the chip area; and a metal-containing accessory pattern disposed on the scribe lines, wherein in the second scribe lines, the accessory pattern is absent in at least the outermost surface iii an area adjacent to the edge having the electrode pad in the chip area.

For sufficiently reducing a width, of a scribe; line to obtain semiconductor chips as many as possible from a piece of semiconductor wafer, it is necessary to remove an interlayer insulating film by laser irradiation before dicing. In this invention, a metal-containing accessory pattern is absent, in at least the outermost surface of an area adjacent to an electrode pad in a second scribe line. Thus, even when the second scribe line is irradiated with a laser beam, the electrode pad is never contaminated due to metal scattering. The accessory pattern may be disposed on a first scribe line which is adequately wide to eliminate the necessity of laser irradiation before dicing.

This invention also provides a method of manufacturing a semiconductor device, comprising the steps of:

preparing the above semiconductor wafer;

forming a groove in the second scribe lines by laser irradiation; and cutting the first and the second scribe lines with a blade;

wherein at least parts in the first scribe lines other than intersections with the second scribe lines are not irradiated with a laser beam.

In this manufacturing method, the first scribe lines comprising the metal-containing accessory pattern is not irradiated with a laser beam, so that contamination of the electrode pad due to metal scattering is avoided. Here, even when the intersection area between the first and the scribe lines is irradiated with a laser beam, it is not significant because the intersection area is generally apart from the electrode.

A width of the first scribe line can be reduced to the extent possible as long as chipping daring dicing has no adverse effects on a semi conductor chip, to eliminate the necessity of laser irradiation on the first scribe line, and thus to obtain semiconductor chips as many as possible from a piece of semiconductor wafer.

This invention can increase the number of semiconductor chips obtained from a piece of semiconductor wafer. Furthermore, this invention can prevent an electrode pad from being contaminated with, a metal scattered from an accessory pattern formed on a scribe line during laser irradiation for removing an interlayer insulating film in a semiconductor wafer.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. These skilled in tide art will recognize that many alternative embodiments can be accomplished using the teachings of the present invention, and that the invention is not limited to the embodiments illustrated for explanatory purpose.

Example 1

Figure 1:
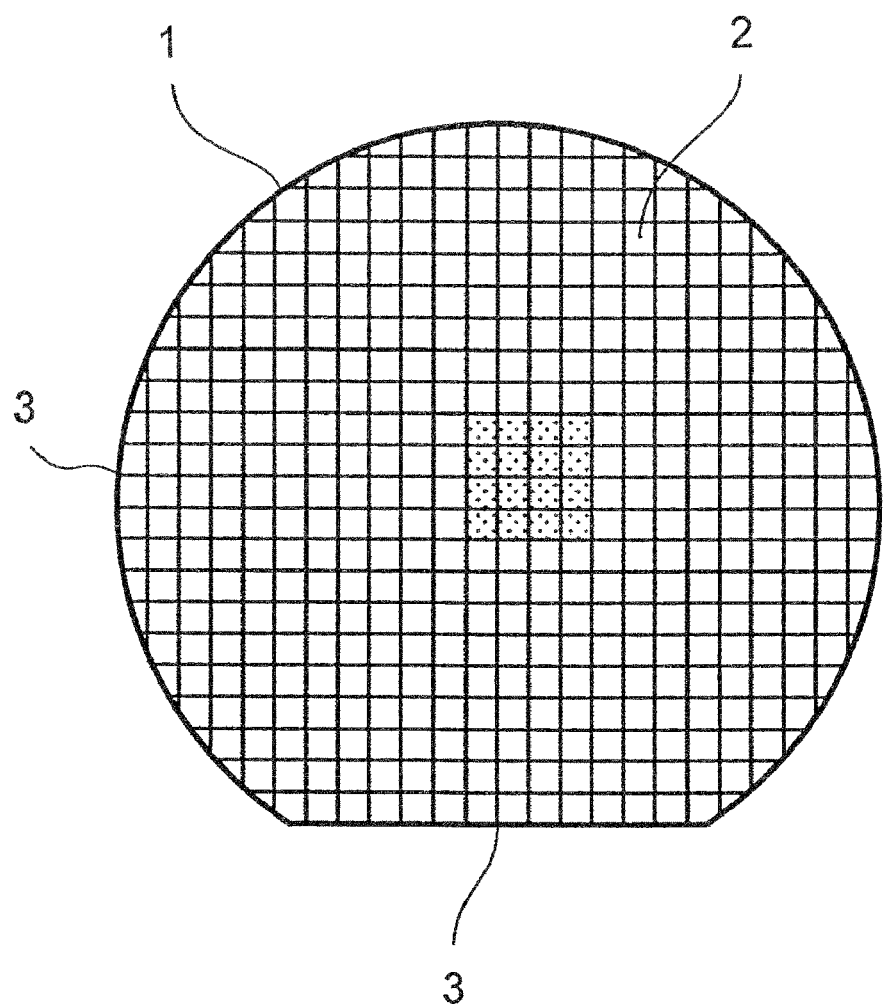
FIG. 1 is a schematic plan, view of a semiconductor wafer according to the prior art.
Figure 2:
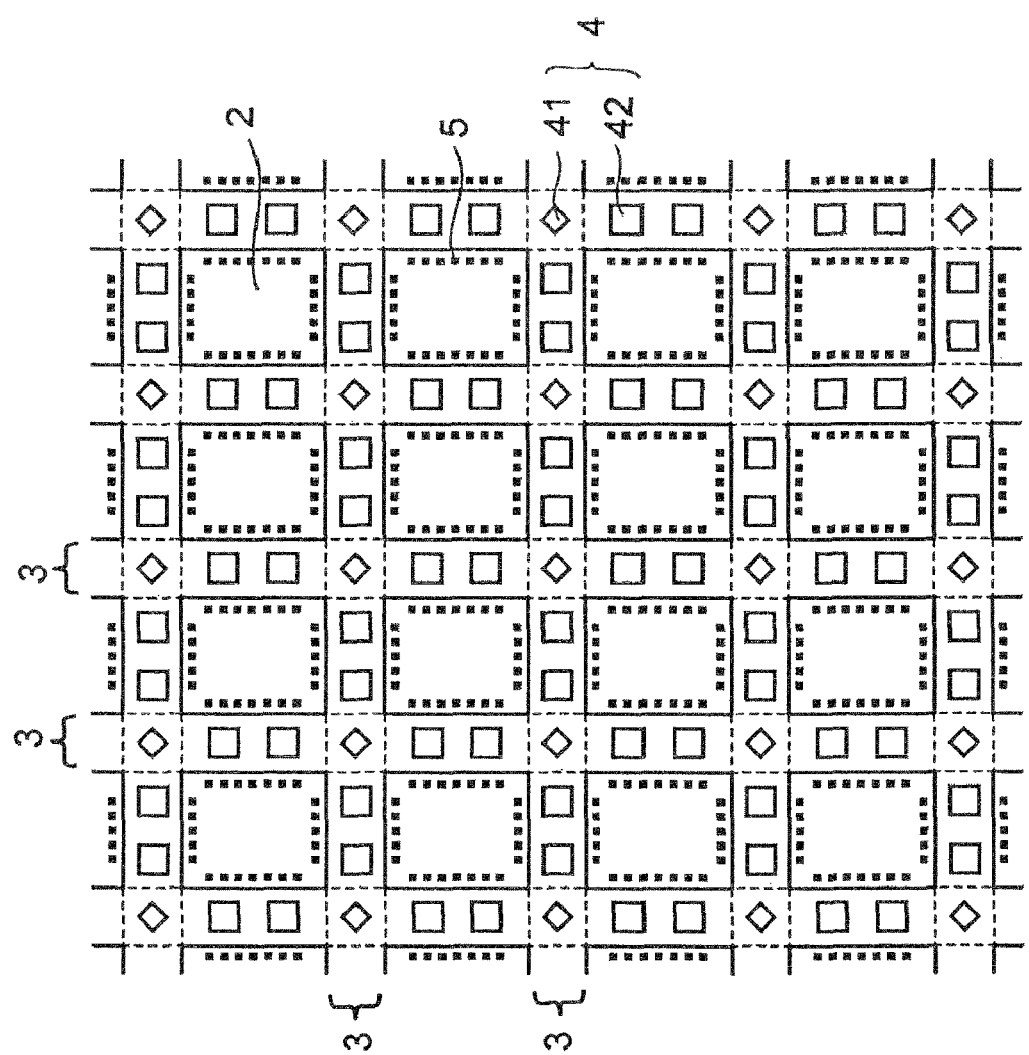
FIG. 2 is a partially enlarged view of FIG. 1.
Figure 3:
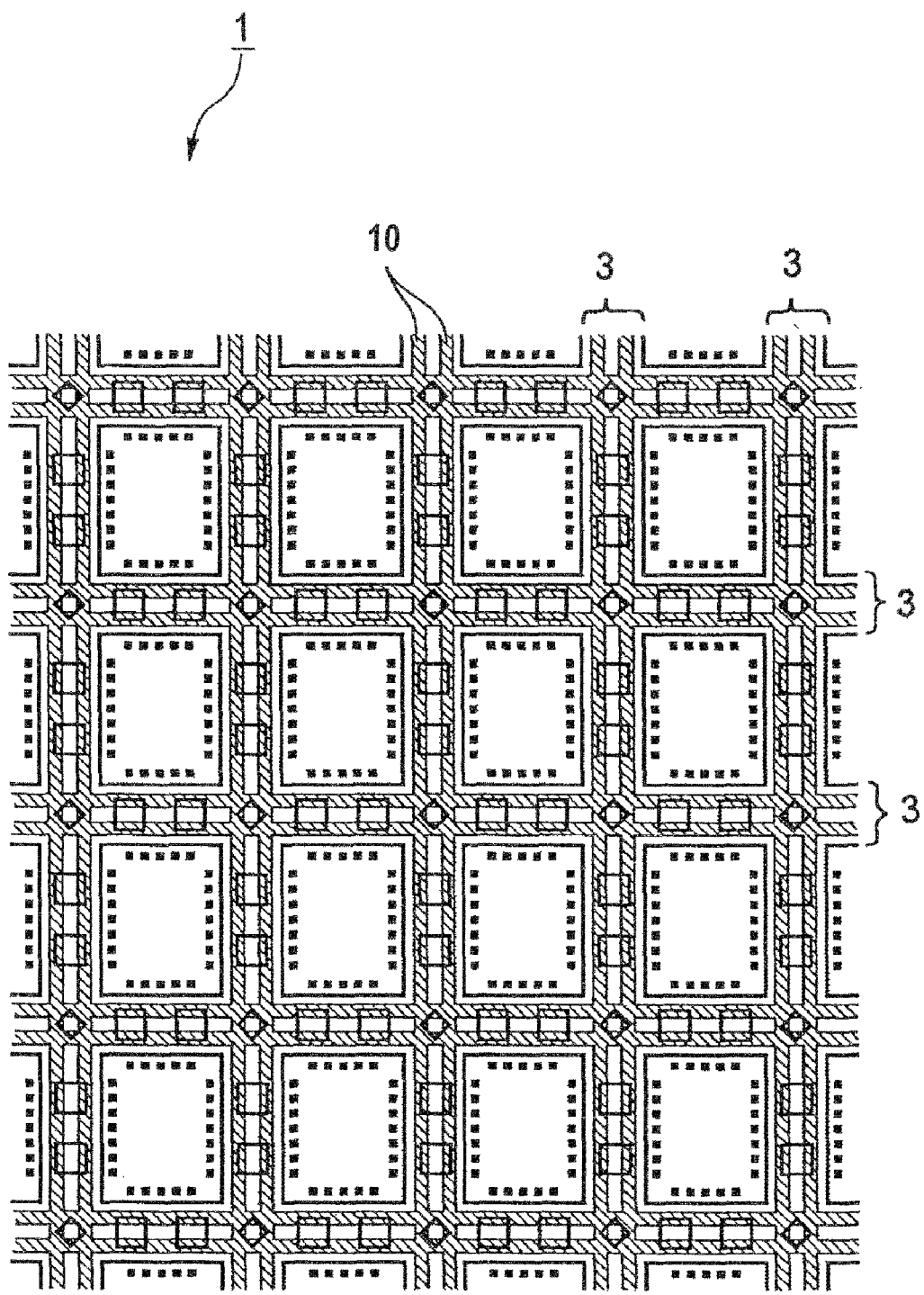
FIG. 3 shows a laser irradiation process in a conventional dicing method.
Figure 4:
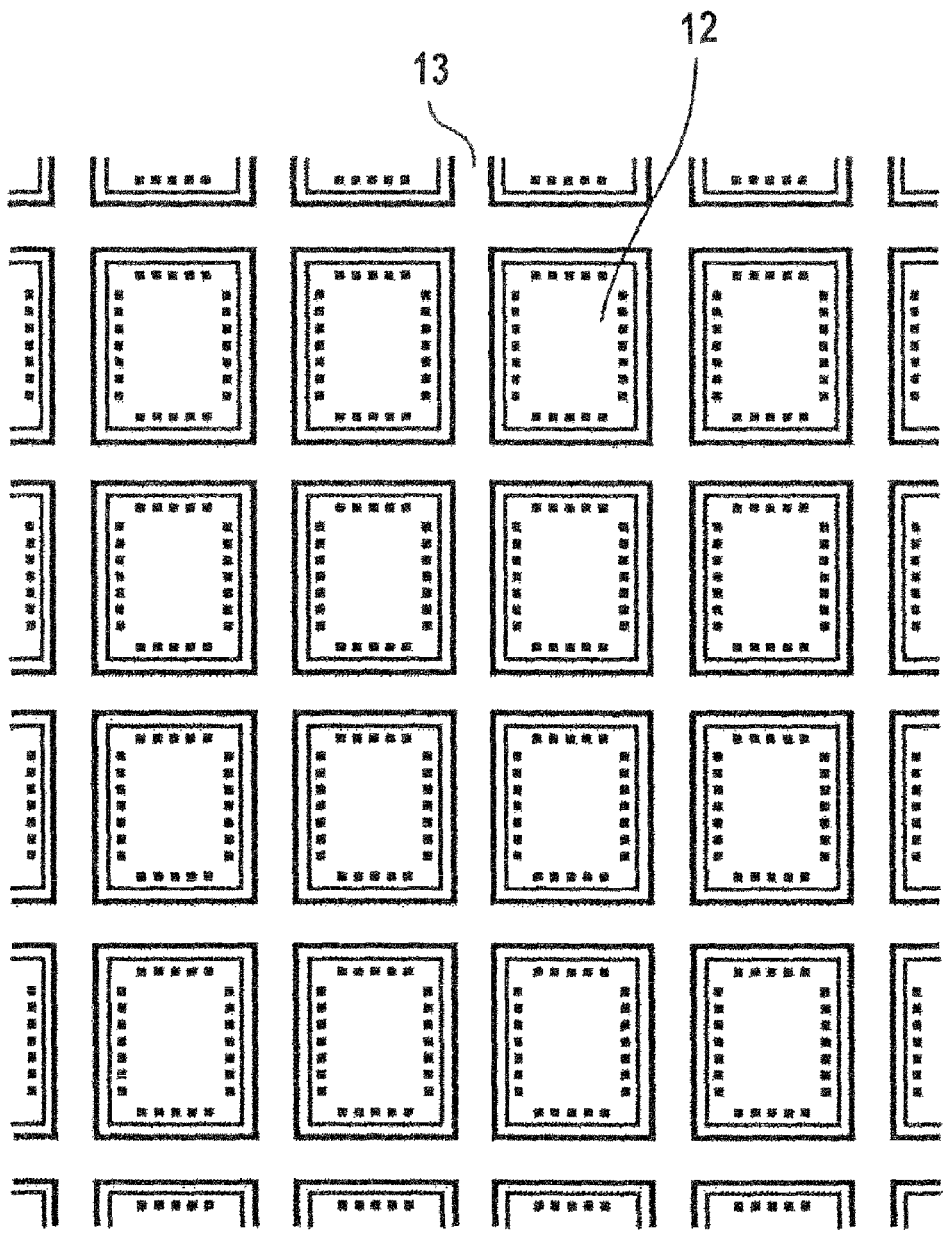
FIG. 4 shows the semiconductor wafer in FIG. 3 after dicing.
Figure 5:
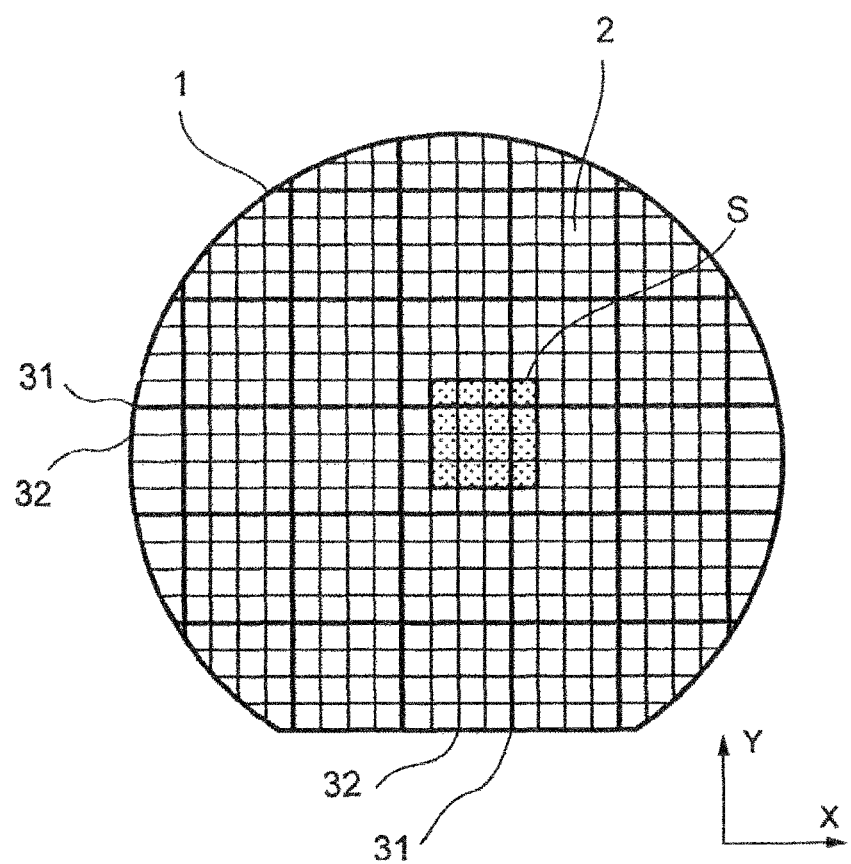
FIG. 5 is a schematic plan view of a semiconductor wafer in Example 1.

As the most preferred embodiment of this invention, Example 1 will be described with reference to FIGS. 5 and 6. In FIG. 5, a X-Y coordinate axis system is used for conveniently indicating a direction in description.

FIG. 5 is a general view of a semiconductor wafer according to tins example.

On a semiconductor wafer 1, there are formed a plurality of semiconductor chips (chip areas) 2. First scribe lines 31 and second scribe lines 32 intervene between adjacent semiconductor chips 2. In other words, the semiconductor wafer 1 are divided by the first scribe lines 31 and the second scribe lines 32 into the plurality of chip areas 2.

The term, "scribe line" as used herein, refers to which is cut by a cutting blade or cutting laser when dividing the semiconductor wafer 1 into separate semiconductor chips 2.

Since the semiconductor chips 2 are aligned as a matrix, the first scribe lines 31 and the second scribe lines 32 are formed in two substantially mutually perpendicular directions. In the example in FIG. 5, the first scribe lines 31 and the second scribe lines 32 are formed in X- and Y-directions, respectively.

The scribe lines having a first width are the first scribe lines 31 while the scribe lines having a second width smaller than the first width are the second scribe lines 32. The accessory pattern 4 is disposed at the broader first scribe lines 31. Between the plurality of the substantially parallel first scribe lines 31, there are farmed several second scribe lines 32.

In this example, as shown in FIG. 5, three second scribe lines 32 are formed between the first scribe lines 31. In both X- and Y-directions, several second, scribe lines 32 are formed between the plurality of substantially parallel first scribe lines 31. As shown in FIG. 5, the semiconductor wafer 1 is divided by the first scribe lines 31 into given areas. The given areas are divided by the second scribe lines 32 into chip areas.

Here, the number of the semiconductor chips 2 obtained from a piece of semiconductor wafer 1 can be increased by forming the first scribe lines 31 in a frequency as low as possible.

A width of the second scribe line 32 is reduced as much as possible to maximize the number of the semiconductor chips 2 obtained from a piece of semiconductor wafer 1 as long as dicing can be conducted. A width of the first scribe line 31 is reduced as much as possible, as long as the accessory pattern 4 can be formed and chipping during dicing has no influence on the semiconductor chip 2.

For example, the first width of the first scribe line 31 may be 60 μm to 120 μm while the width of the second scribe line 32 may be less than 60 μm.

Figure 6:
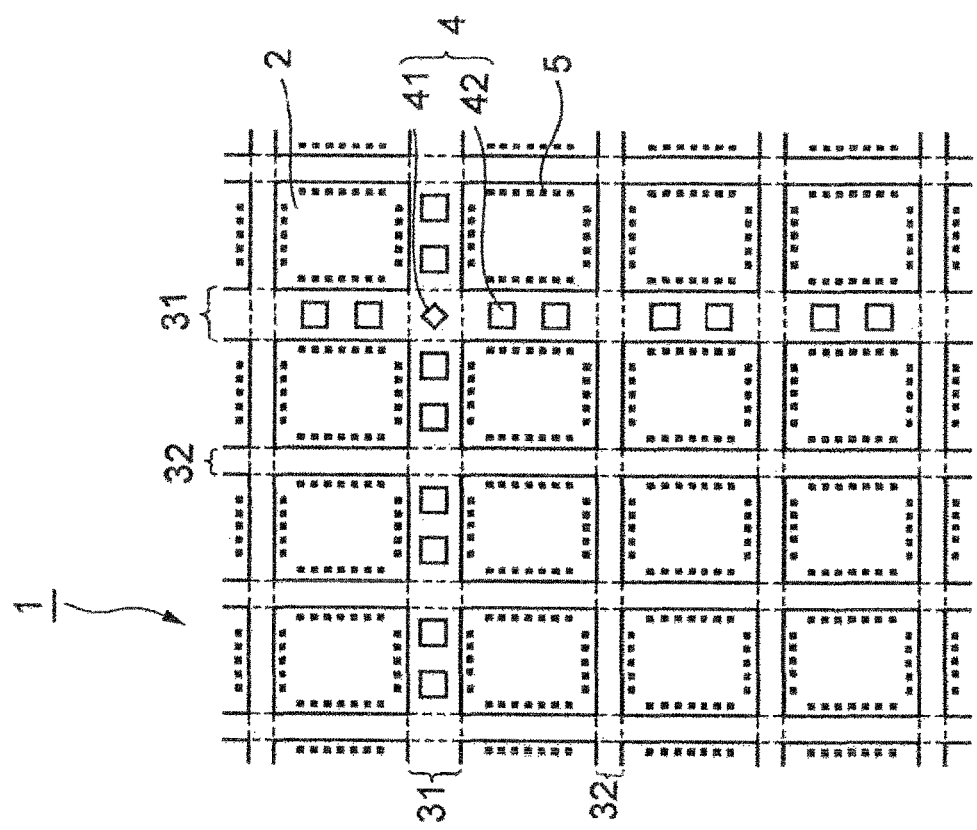
FIG. 6 is a partially enlarged view of FIG. 5.

FIG. 6 enlarges the area S in FIG. 5 (the hatched area in FIG. 5).

As shown in FIG. 6, the semiconductor chip 2 comprises an electrode pad 5 in the area adjacent to the scribe lines 31, 32.

Furthermore, the accessory pattern 4 is disposed only in the first scribe line 31, but not in the second scribe line 32. However provided that the accessory pattern 4 may be disposed in an intersection area between the first scribe line 31 and the second scribe line 32. In this example, a combination of the alignment mart 41 and the TEG 42 is collectively called an accessory pattern 4.

Next, a process for dicing a semiconductor wafer shown in FIG. 6 will be described with reference to FIGS. 7, 8 and 9.

Figure 7:
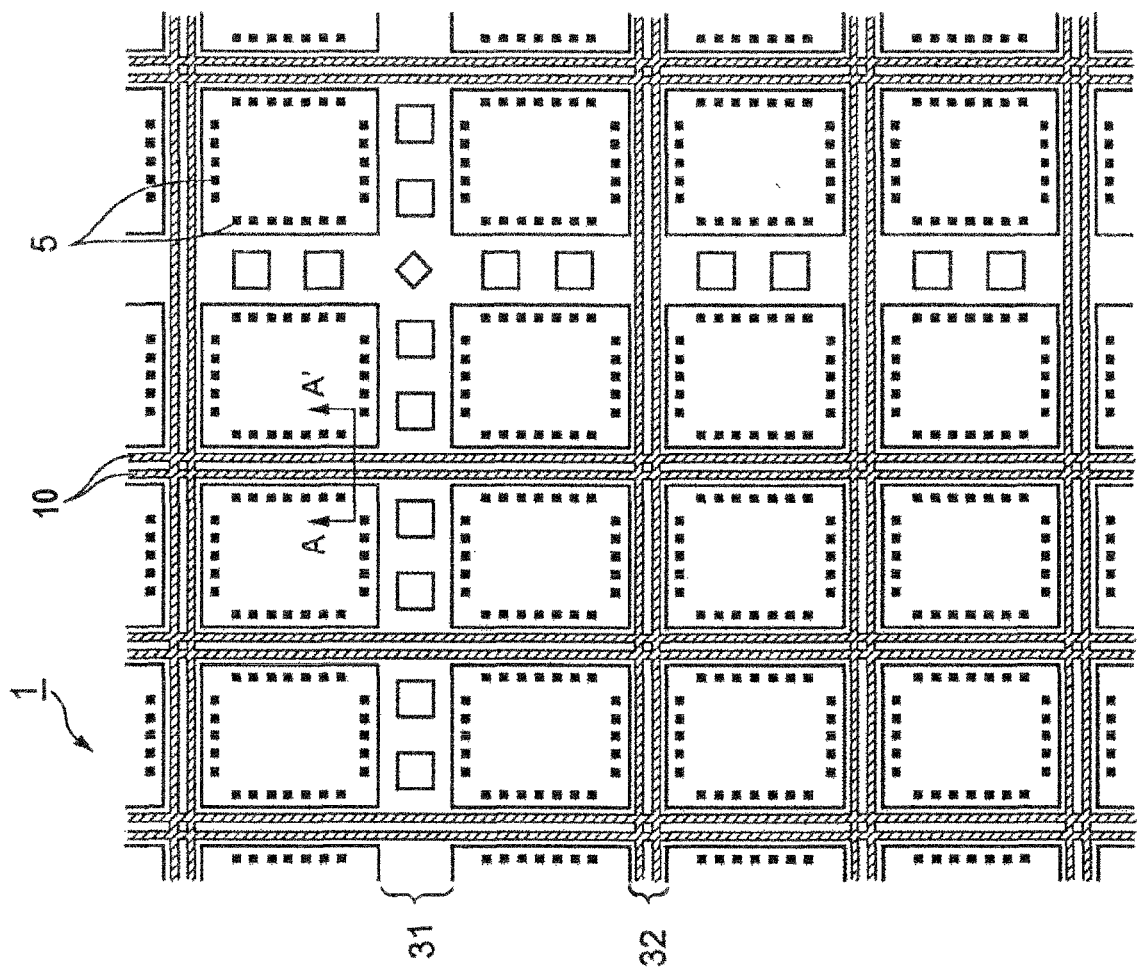
FIG. 7 shows a laser irradiation process in a process according to this invention.
Figure 8:
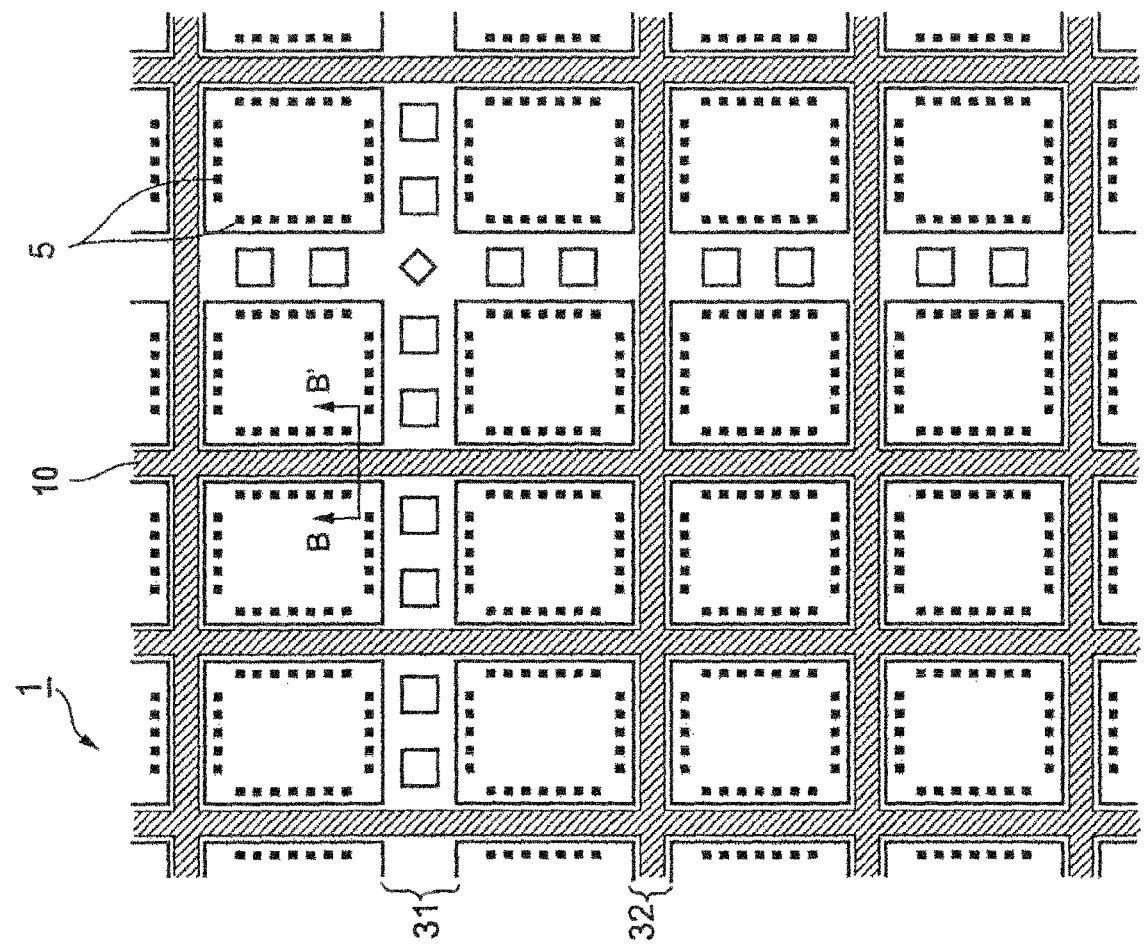
FIG. 8 shows a laser irradiation process in a process according to this invention.

As shown in FIG. 7 or 8, the second scribe lines 32 are irradiated with, a laser beam to remove an interlayer insulating film in the second scribe lines 32. As a result, grooves (laser irradiated areas 10) are formed in the second scribe lines 32. Since no accessory patterns are formed in the second, scribe lines 32, the electrode pads 5 are never contaminated by scattering metal contained in the accessory pattern by laser irradiation.

Figure 10A:
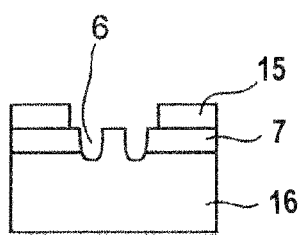
FIG. 10A is a cross-sectional view taken on line A-A' of FIG. 7.
Figure 10B:
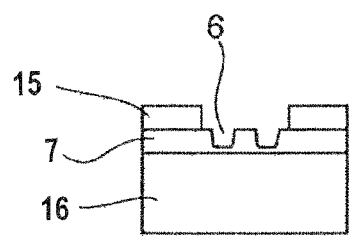
FIG. 10B is a cross-sectional view taken on line A-A' of FIG. 7.

FIG. 7 shows an example of forming two parallel, grooves (laser irradiated areas 10) in one second scribe line 32 by laser irradiation. FIGS. 10A and 10B are cross-sectional views taken on line A-A' of FIG. 7. FIG. 10A shows an example where the grooves 6 penetrate the interlayer insulating film 7 and reach a silicon layer 16 in the semiconductor wafer 1, while FIG. 10B shows an example where the grooves 6 do not reach the silicon layer 16.

Figure 11A:
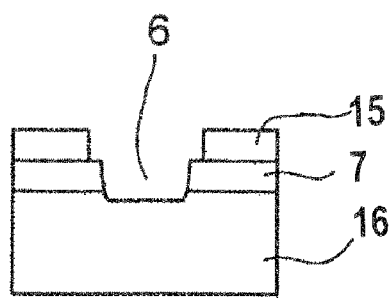
FIG. 11A is a cross-sectional view taken on line B-B' of FIG. 8.
Figure 11B:
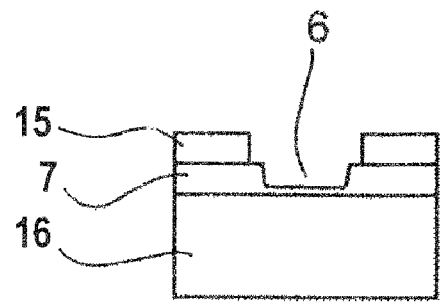
FIG. 11B is a cross-sectional view taken on line B-B' of FIG. 8.

FIG. 8 shows an example of forming one groove (a laser irradiated area 10) in one second scribe line 32 by laser irradiation. FIGS. 11A and 11B are cross-sectional views taken on line B-B' of FIG. 8. FIG. 11A shows an example where the grooves 6 penetrate the interlayer insulating film 7 and reach a silicon layer 16 in the semiconductor wafer 1, while FIG. 11B shows an example where the grooves 6 do not reach the silicon layer 16.

Here, since the first scribe lines 31 having the accessory pattern 4 are not irradiated with a laser beam, the electrode pads 5 are not contaminated by scattering metal contained in the accessory pattern.

Figure 9:
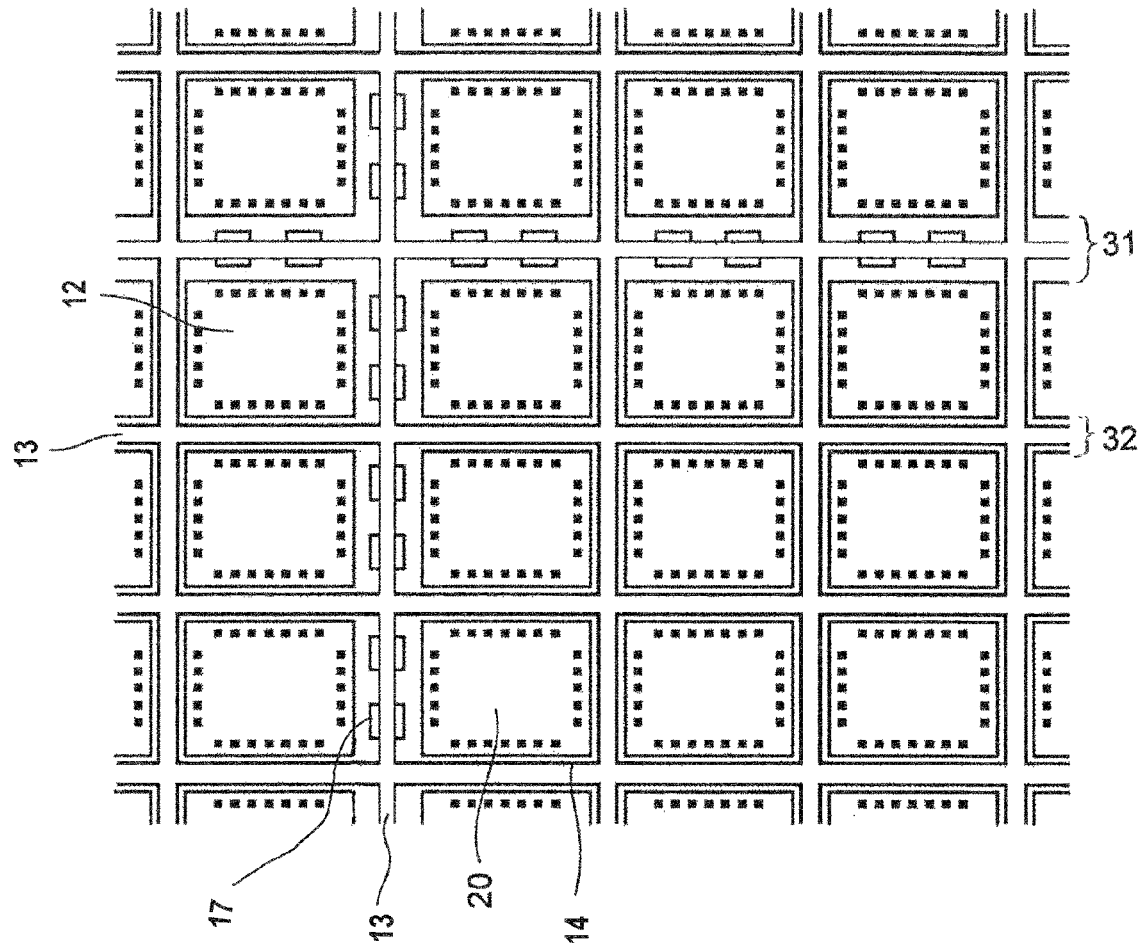
FIG. 9 shows the semiconductor wafer in FIGS. 7 and 8 after dicing.

Subsequently, as shown in FIG. 9, both first scribe lines 31 and second scribe lines 32 are cut with a cutting blade. Thus, blade-cut areas 13 are formed to give separate semiconductor chips 12. As shown in FIG. 9, in sore semiconductor chips 20 according to the dicing process of this example, edges with a laser irradiation trace 14 may not have a residual trace of the accessory pattern 4, while edges without a laser irradiation trace 14 may have a residual trace 17 of the accessory pattern.

Figure 12A:
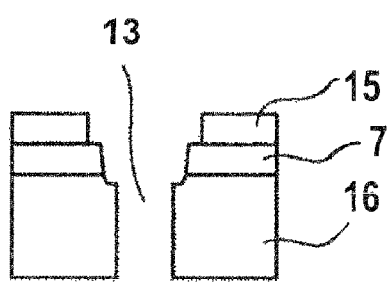
FIG. 12A is a cross-sectional view of the semiconductor wafer in FIGS. 10A and 11A after dicing.
Figure 12B:
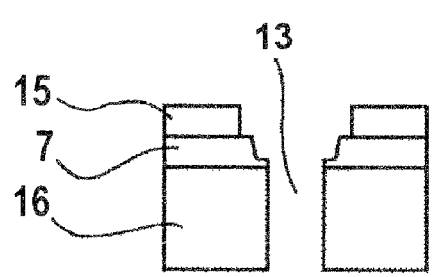
FIG. 12B is a cross-sectional view of the semiconductor wafer in FIGS. 10B and 11B after dicing.

FIG. 12 shows the part in FIGS. 10 and 11 after dicing. FIG. 12A shows the second scribe lines 32 in FIGS. 10A and 11A after dicing. FIG. 12B shows the second scribe lines 32 in FIGS. 10B and 11B after dicing. Since the interlayer insulating film 7 is removed in advance by laser irradiation in the second scribe lines 32, chipping occurring in the scribe lines have no effects, through the interlayer insulating film 7, in the interlayer initiating film 7 at the semiconductor chip 2.

Although the first scribe lines 31 comprise no grooves, the scribe lines themselves are sufficiently wide to prevent clapping from influencing the interlayer insulating film 7 in the semiconductor chips.

Alternatively, the accessory pattern as an alignment mark may be formed not by a metal but by a dopant diffusion layer. Here, an alignment mark is identified by a reflectance difference due to a difference in a dopant concentration. The alignment mark farmed by the dopant diffusion layer may be disposed on the second scribe line because contamination of the electrode pad by a scattered metal never occurs during laser irradiation.

Although the accessory pattern 4 made of a metal is formed on the surface of the semiconductor wafer 1 in FIG. 6, it may be formed within the interlayer insulating film 7. For example, it corresponds to an alignment pattern used in a diffusion process. In this example, if the accessory pattern 4 comprising a metal is positioned in a predetermined depth from the outermost surface of the semiconductor wafer 1, such accessory pattern 4 can be disposed in an area adjacent to the electrode pad 5 in the second scribe line 32. In such case, at least on the outermost surface of the semiconductor wafer 1, accessory pattern 4 comprising a metal cannot be disposed. Because, when the metal contained the accessory pattern 4 is positioned in a predetermined depth from the outermost surface of the semiconductor wafer 1, contamination of the electrode pad 5 due to a scattered metal can be prevented. An experiment demonstrated that When forming the accessory pattern 4 was formed at least 1.5 μm in depth from the outermost surface of the second scribe line 32, contamination of tire electrode pad with, a metal did not occur by laser irradiation of the second scribe line 32. A depth in which an accessory pattern can be disposed, in the second scribe line 32 may vary, depending on the type of the metal constituting the accessory pattern, the type of the interlayer insulating film and a strength of the laser used. However it is preferable that no metal-containing accessory patterns are disposed in an area adjacent to the electrode pad 5 in the second scribe line 32.

In FIG. 6, the alignment mark 41 is formed in the area where the first scribe lines 31 intersect each other and the TEG 42 is formed in another area in the first scribe line 31. However, without being limited to the configuration, the TEG 42 may be formed in an area where the first scribe lines 31 intersect each other while the alignment mark 41 may be formed in another area.

Example 2

Figure 13:
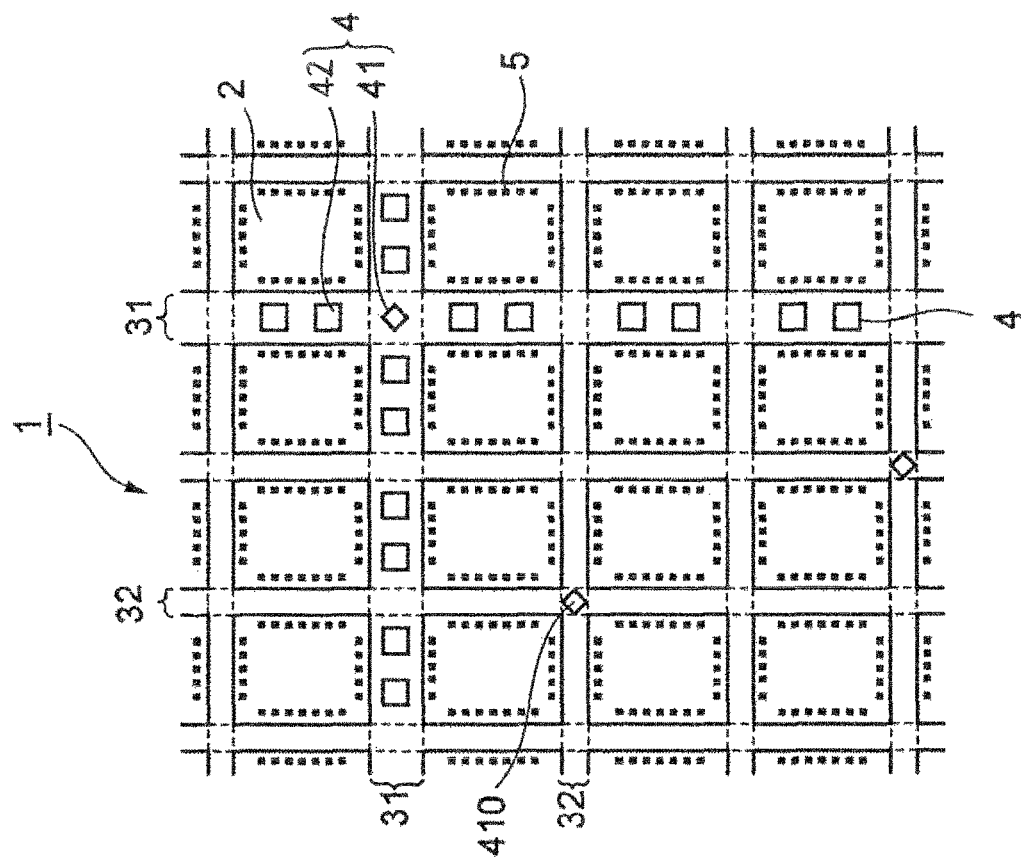
FIG. 13 is a partially enlarged view of a semiconductor wafer in Example 2.

Example 2 of this invention will be described, with reference to FIG. 13.

This example is different from Example 1 in that the accessory pattern 410 is disposed in an area where the second scribe lines 32 intersect each other. The difference will the described, but description of the other components will be emitted.

Since the area where the scribe lines intersect each other is apart from the electrode pad 5 formed an the semiconductor chip 2, contamination of the electrode pad 5 can be substantially prevented even when a metal is scattered from the alignment mark 410 disposed in this area.

The accessory pattern 410 disposed in the area where the second scribe lines 32 intersect each other is desirably alignment marks because disposing a number of alignment marks may improve alignment accuracy.

A method of dicing of the semiconductor wafer 1 in this example is as described in Example 1. It is, however, desirable that the second scribe lines except the alignment marls 410 formed, in the areas where the second scribe lines 32 intersect each other are irradiated with, a laser beam to leave the alignment marks 410. It is because the intact alignment marks 410 may be utilized in the subsequent process of blade cutting.

Example 3

Figure 14:
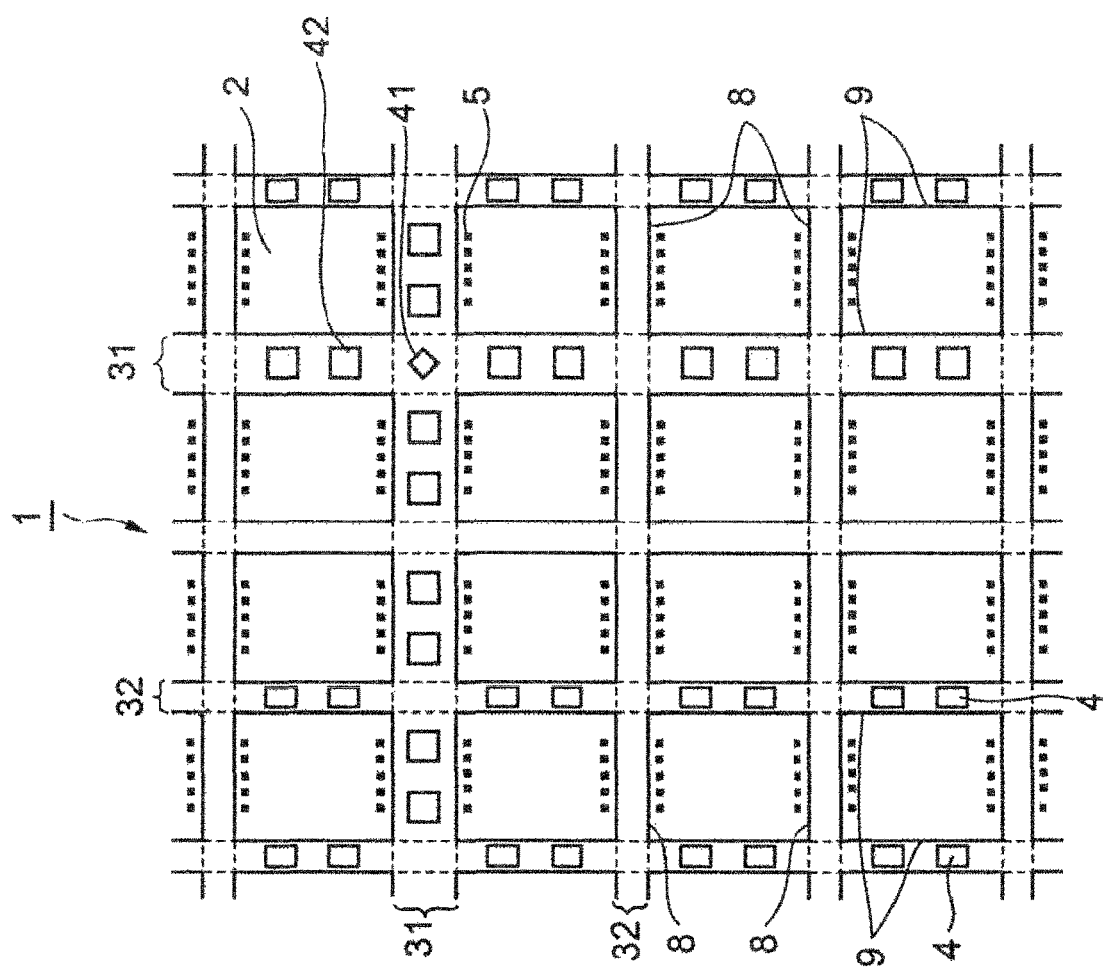
FIG. 14 is a partially enlarged view of a semiconductor wafer in Example 3.

Example 3 of this invention, will be described with reference to FIG. 14.

This example is different from Example 1 in. that in each semiconductor chip 2, an electrode pad 5 is formed only along two opposite edges 8 in one direction, and that an accessory pattern 4 is formed on a given second scribe line 32 adjacent to two opposite edges 9 without the electrode pad 5 in the other direction. These differences will be described, but description of the other components will be omit red.

The accessory pattern 4 may be disposed in the second scribe line 32 adjacent to two edges 9 without an electrode pad 5, to prevent the electrode pad 5 from being contaminated even when a metal is scattered by laser irradiation.

Figure 15:
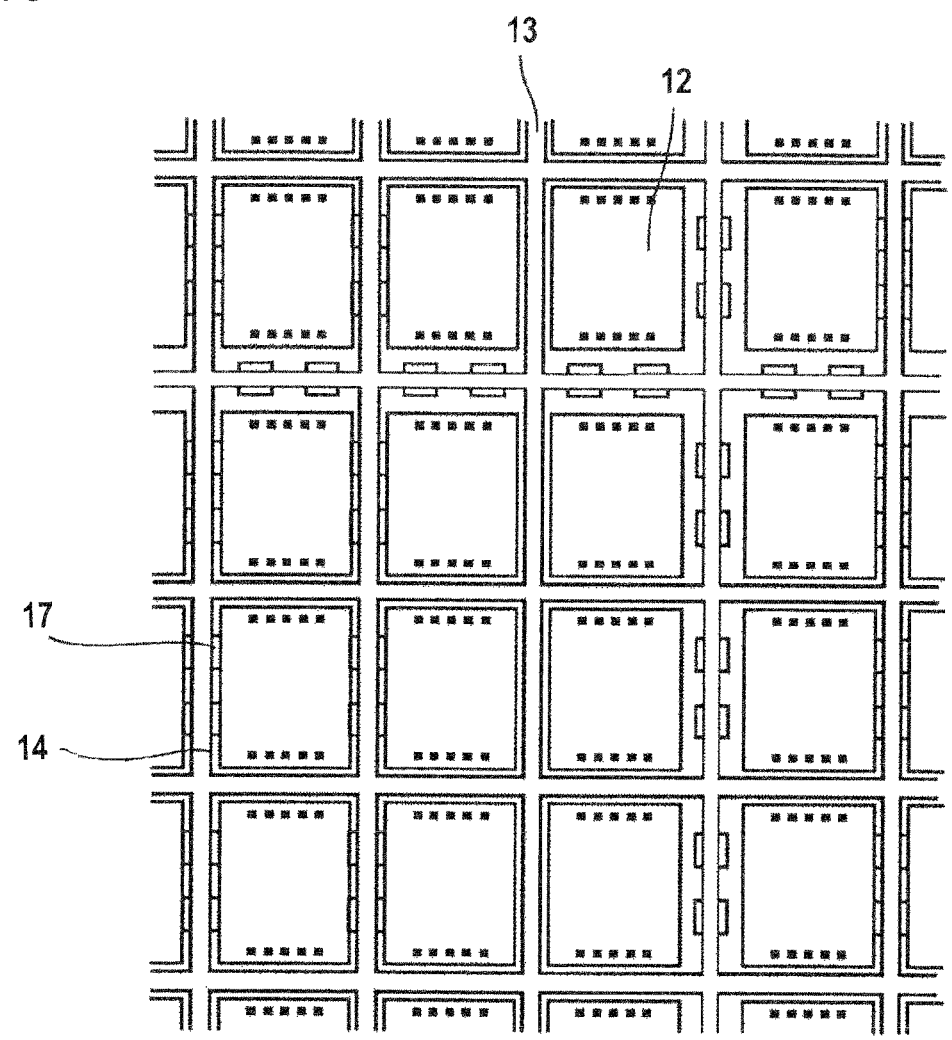
FIG. 15 is a partially enlarged view showing the semiconductor wafer in FIG. 14 after dicing.

A method of dicing of the semiconductor wafer 1 in this example is as described in Example 1. FIG. 15 shows the semiconductor wafer 1 of this example after dicing. In tins example, since the accessory pattern 4 is formed in the second scribe line 32 which, is not adjacent to the electrode pad 5, both laser irradiation trace 14 and, accessory pattern trace 17 may remain in an edge without an electrode pad 5 in a separate chip.

Example 4

Figure 16:
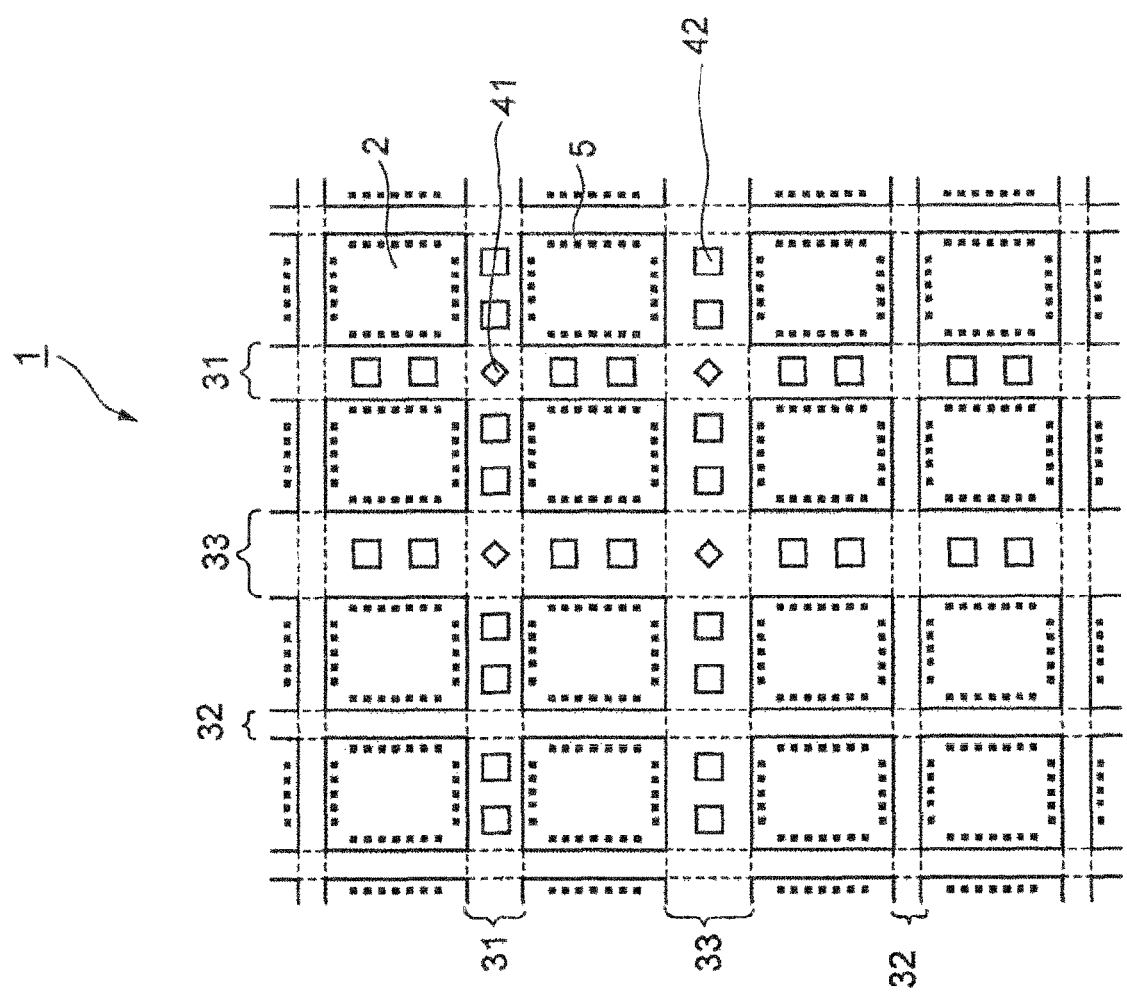
FIG. 16 is a partially enlarged view of the semiconductor wafer in Example 4.

Example 4 of this invention will be described with reference to FIG. 16.

This example is different from Example 1 in that there are third scribe lines 33 broader than, the first scribe line 31. For example, the third scribe line 33 may have a width of more than 120 μm. This difference will be described, but description of the other components will be omitted.

The third scribe line 33 is sufficiently broad to prevent the semiconductor chip 2 from being influenced by chipping occurring during blade cutting. Furthermore, even when an accessory pattern 4 is disposed in the third scribe line 33 and a metal constituting the accessory pattern 4 is scattered by laser irradiation, the metal does not reach the electrode pad 5 in the semiconductor chip 2.

Therefore an accessory pattern 4 may be formed an the third scribe line 33 along the edge with the electrode pad 5 in an adjacent semiconductor chip 2. The third scribe, line 33 can be cut with a blade after laser irradiation or without laser irradiation.

The first scribe lines 31 and the second scribe lines 32 are cut as described in Example 1.

In the present invention, as shown in, e.g., FIG. 6, the first scribe lines 31 are formed in two mutually perpendicular directions and accessory patterns 4, particularly TEGs 42 are disposed as a cross. An advantage of tins configuration will be described below.

A TEG 42 consists of a device such as a transistor for inspecting performance of a process for manufacturing a semiconductor chip 2, and a pad electrically connecting the device to the external member. Depending of the type of inspecting and/or the step) to be inspected, multiple types of TEGs are formed. In a current semiconductor wafer, 20 types of TEGs may be formed.

Furthermore, TEGs are formed over the whole surface of a semiconductor wafer because positional variation in manufacturing has been generated on a piece of semiconductor wafer as a size of a semiconductor wafer has become larger recently.

Figure 17:
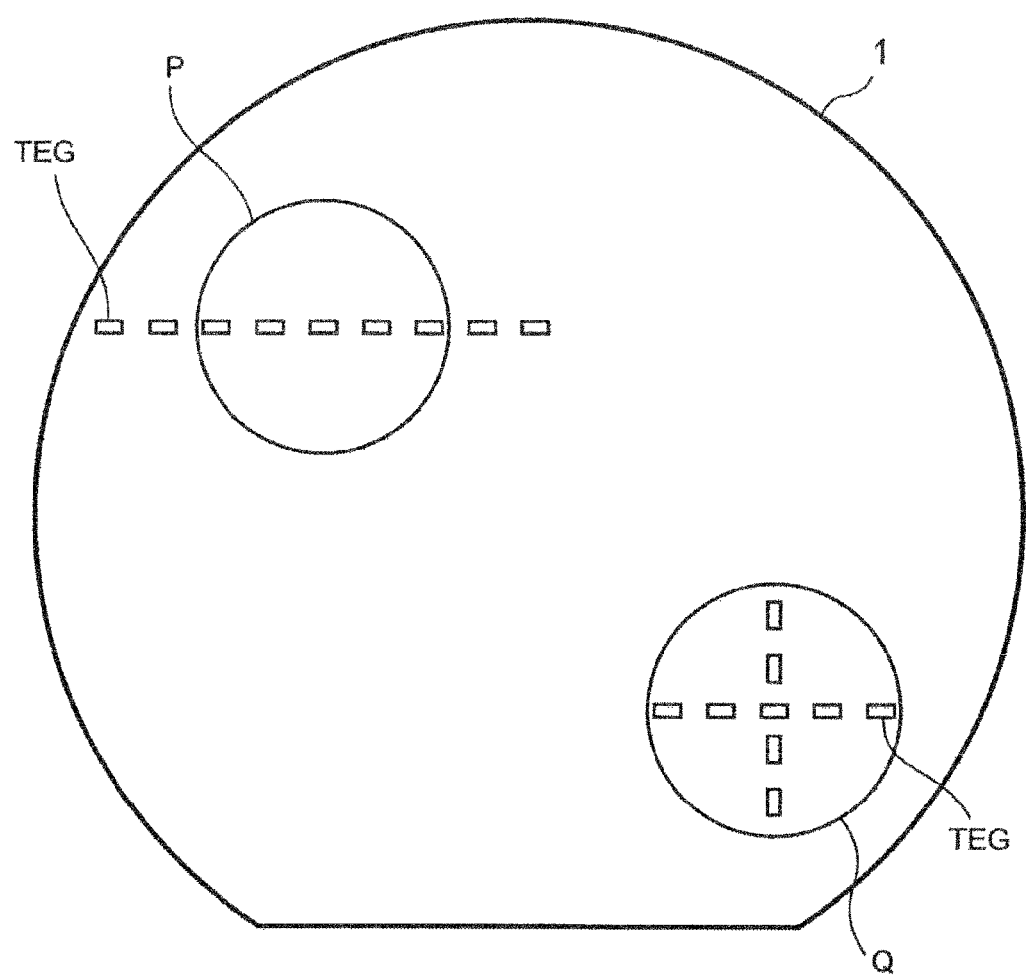
FIG. 17 illustrates an advantage of aligning TEGs as a cross.

Here, there will be described a case where for inspecting performance of a manufacturing process within areas P and Q on semiconductor wafer 1 shown in FIG. 17, there are an equal number of TEGs at regular intervals in these areas. The areas P and Q have an equal area.

If the TEGs are aligned as a straight line, some TEGs axe outside of the area P as the number of TEGs increases. Therefore they cannot be used for inspecting the area within P.

On the other hand, aligning them as a cross in this invention is quite advantageous in that more TEGs can be placed in the area Q than the area P.

It is apparent that the present invention is not limited to the above embodiment, that may be modified, and changed without departing from the scope and spirit of the invention.

The invention claimed is:

1. A method of manufacturing a semiconductor device, comprising the steps of:
   preparing a semiconductor wafer comprising:
   a plurality of first scribe lines extending in two mutually perpendicular directions, said first scribe lines having a first width and dividing the semiconductor wafer into a plurality of areas;
   a plurality of second scribe lines having a second width smaller than the first width, said second scribe lines dividing the area into a plurality of semiconductor chip areas;
   an electrode pad formed along the edge of the chip area; and
   a metal-containing accessory pattern disposed in the scribe lines,
   wherein in the second scribe lines, the metal-containing accessory pattern is absent in at least the outermost surface in an area adjacent to the edge having the electrode pad in the semiconductor chip area; and
   forming a groove in the second scribe lines by irradiating with a laser beam; and cutting the first scribe lines and the second scribe lines with a blade;
   wherein at least parts in the first scribe lines other than intersections with the second scribe lines are not irradiated with the laser beam.

2. The method as claimed in claim 1, wherein the metal-containing accessory pattern is absent in the second scribe line.

3. The method as claimed in claim 1, wherein the metal-containing accessory pattern is formed in an area where the second scribe lines intersect each other.

4. The method as claimed in claim 3, wherein the metal-containing accessory pattern is an alignment mark.

5. The method as claimed in claim 1, wherein the first width is 60 μm to 120 μm both inclusive and the second width is less than 60 μm.

6. The method as claimed in claim 1, wherein a plurality of the metal-containing accessory pattern are disposed as a cross in two crossing first scribe lines.

7. The method as claimed in claim 1, further comprising a plurality of third scribe lines having a third width larger than the first width, wherein a metal-containing accessory pattern is formed in said third scribe line.

8. The method as claimed in claim 7, wherein the first width is 60 μm to 120 μm both inclusive and the second width is less than 60 μm and the third width is more than 120 μm.

9. A method of manufacturing a semiconductor device, comprising the steps of:
   preparing a semiconductor wafer comprising:
   a plurality of first scribe lines extending in two mutually perpendicular directions, said first scribe lines having a first width and dividing the semiconductor wafer into a plurality of areas;
   a plurality of second scribe lines having a second width smaller than the first width, said second scribe lines dividing the area into a plurality of semiconductor chip areas;
   an electrode pad formed along the edge of the chip area; and
   a metal-containing accessory pattern disposed in the scribe lines,
   wherein in the second scribe lines, the metal-containing accessory pattern is absent in at least the outermost surface in an area adjacent to the edge having the electrode pad in the semiconductor chip area, the metal-containing accessory pattern is absent in the second scribe line, the metal-containing accessory pattern is formed in an area where the second scribe lines intersect each other, and the metal-containing accessory pattern is an alignment mark;

forming a groove in the second scribe lines except the alignment mark by laser irradiation; and cutting the first scribe lines and the second scribe lines with a blade.

10. The method as claimed in claim 9, wherein the first width is 60 μm to 120 μm both inclusive and the second width is less than 60 μm.

11. The method as claimed in claim 9, wherein a plurality of the metal-containing accessory pattern are disposed as a cross in two crossing first scribe lines.

12. The method as claimed in claim 9, further comprising a plurality of third scribe lines having a third width larger than the first width, wherein a metal-containing accessory pattern is formed in said third scribe line.

13. The method as claimed in claim 12, wherein the first width is 60 μm to 120 μm both inclusive and the second width is less than 60 μm and the third width is more than 120 μm.

* * * * *